US011342116B2

(12) United States Patent
Sueyoshi et al.

(10) Patent No.: US 11,342,116 B2
(45) Date of Patent: May 24, 2022

(54) POLYPROPYLENE FILM, METAL LAYER-INTEGRATED POLYPROPYLENE FILM, AND FILM CAPACITOR

(71) Applicant: Oji Holdings Corporation, Tokyo (JP)

(72) Inventors: Michiko Sueyoshi, Tokyo (JP); Akihiro Kakehi, Tokyo (JP); Takeshi Tominaga, Tokyo (JP); Yoshimune Okuyama, Tokyo (JP)

(73) Assignee: Oji Holdings Corporation, Tokyo (JP)

( * ) Notice: Subject to any disclaimer, the term of this patent is extended or adjusted under 35 U.S.C. 154(b) by 303 days.

(21) Appl. No.: 16/633,062

(22) PCT Filed: Aug. 1, 2018

(86) PCT No.: PCT/JP2018/028853
§ 371 (c)(1),
(2) Date: Jan. 22, 2020

(87) PCT Pub. No.: WO2019/026958
PCT Pub. Date: Feb. 7, 2019

(65) Prior Publication Data
US 2020/0176188 A1 Jun. 4, 2020

(30) Foreign Application Priority Data

Aug. 2, 2017 (JP) .............................. JP2017150280
May 9, 2018 (JP) .............................. JP2018090414
Jul. 31, 2018 (JP) .............................. JP2018143648

(51) Int. Cl.
C08J 5/18 (2006.01)
H01B 3/44 (2006.01)
B32B 15/085 (2006.01)
B32B 27/32 (2006.01)
H01G 4/14 (2006.01)
C23C 14/24 (2006.01)
H01G 4/32 (2006.01)
C08J 7/04 (2020.01)
C08J 7/044 (2020.01)

(52) U.S. Cl.
CPC ............... *H01G 4/14* (2013.01); *C08J 5/18* (2013.01); *C23C 14/24* (2013.01); *H01G 4/32* (2013.01); *B32B 15/085* (2013.01); *B32B 27/32* (2013.01); *C08J 7/044* (2020.01); *C08J 7/0423* (2020.01); *C08J 2323/12* (2013.01); *H01B 3/441* (2013.01)

(58) Field of Classification Search
None
See application file for complete search history.

(56) References Cited

U.S. PATENT DOCUMENTS 10,093,792 B2 * 10/2018 Ishida .................... B32B 27/32
10,431,380 B2 * 10/2019 Nakata .................... C08L 23/14
11,142,618 B2 * 10/2021 Tominaga ............... C08L 23/12
2017/0121515 A1    5/2017 Ishida et al.
2017/0229243 A1 *  8/2017 Nakata ..................... H01G 4/18

FOREIGN PATENT DOCUMENTS

| CN | 106795300 A | 5/2017 |
| EP | 3431530 A1 | 1/2018 |
| EP | 3296348 A1 | 3/2018 |
| JP | 1-166955 A | 6/1989 |
| JP | 2012-133074 A | 7/2012 |
| JP | 2014-231584 A | 12/2014 |
| KR | 10-2016-0140632 A | 12/2016 |
| WO | WO 2016/051496 A1 | 4/2016 |
| WO | WO 2016/182003 A1 | 11/2016 |
| WO | WO 2017/159103 A1 | 9/2017 |

OTHER PUBLICATIONS

Office Action in Chinese Patent Application No. 201880049546.2 dated Nov. 26, 2021.
Office Action in Korean Patent Application No. 10-2020-7002331 dated Jul. 12, 2021.
International Search Report in International Application No. PCT/JP2018/028853 dated Oct. 9, 2018.
International Preliminary Report on Patentability in International Patent Application No. PCT/JP2018/028853, dated Feb. 4, 2020.
Office Action in Chinese Patent Application No. 201880049546.2, dated Mar. 9, 2022.

* cited by examiner

*Primary Examiner* — Richard A Huhn
(74) *Attorney, Agent, or Firm* — Knobbe Martens Olson & Bear LLP

(57) ABSTRACT

A polypropylene film which has a crystallite size of not more than 12.2 nm, the crystallite size being determined using Scherrer's equation from a full width at half maximum of the reflection peak from (040) plane of α crystal measured by a wide-angle X-ray diffraction method, and a volume resistivity of not lower than $6 \times 10^{14}$ Ω·cm, the volume resistivity being calculated in accordance with equation I from a current value that is measured 1 minute after applying a voltage at a potential gradient of 200 V/μm in an environment at 100° C. Equation I: volume resistivity=[(effective electrode area)×(applied voltage)]/[(polypropylene film thickness)×(current value)].

7 Claims, No Drawings

POLYPROPYLENE FILM, METAL LAYER-INTEGRATED POLYPROPYLENE FILM, AND FILM CAPACITOR

CROSS REFERENCE TO RELATED APPLICATIONS

The present application claims the benefit of priority to Japanese Patent Application No. 2017-150280 filed on Aug. 2, 2017, Japanese Patent Application No. 2018-90414 filed on May 9, 2018, and Japanese Patent Application No. 2018-143648 filed on Jul. 31, 2018. The disclosures of the Japanese Patent Applications are incorporated herein in their entirety by reference.

TECHNICAL FIELD

The present invention relates to a polypropylene film, a metal layer-integrated polypropylene film, and a film capacitor.

BACKGROUND ART

Polypropylene films have excellent electric characteristics such as high dielectric strength and low dielectric loss, and have high moisture resistance, and are widely used in electronic devices and electrical machinery and apparatus. Specifically, polypropylene films are used in high voltage capacitors, various switched mode power supplies, capacitors for filter (such as convertor, and inverter), and smoothing capacitors.

Regarding polypropylene films, Patent Document 1 indicates that the reliability can be impaired when the volume resistivity at 110° C. is less than $5 \times 10^{14}$ Ω·cm (see paragraph 0028 in Patent Document 1).

It is considered that the reliability in Patent Document 1 means the strength of the capacitor against short-time application of high voltage, namely the strength of the capacitor against the dielectric breakdown in a short time. This consideration is based on the description in paragraphs 0141, 0147, 0148-0151 of Patent Document 1. This description includes the description of repeating application of a voltage of 300 V DC to the capacitor element, followed by elevation of the applied voltage at 50 V DC/1 minute 10 minutes after application of the voltage, the description of elevating the voltage until the capacitance reduces to 10% or less relative to the initial value, and disassembling the capacitor element to examine the state of the breakdown to evaluate the reliability, and the description of employing whether a penetrating breakdown is observed so as to evaluate the reliability.

PRIOR ART DOCUMENTPATENT DOCUMENT

Patent Document 1: WO 2016/182003

SUMMARY OF THE INVENTION

Problems to be Solved by the Invention

The strength against the dielectric breakdown of the capacitor in a short time, and the reliability of bearing the long-term use of the capacitor, namely the strength against the insulation deterioration should be distinguished from each other. One reason for this is that a capacitor having excellent strength against the dielectric breakdown in a short time can sometimes be poor in strength against the insulation deterioration.

As an index for the long-term reliability, the present inventors initially employed the degree of deterioration in capacitance in the life test typified by 1000-hour-application of DC 700 V to the capacitor.

However, the present inventors noticed that the reliability of bearing the long-term use is not usually ensured in some cases despite the small degree of decrease in capacitance.

The present inventors made diligent investigation based on such notice, and found that a capacitor having high reliability of bearing long-term use by suppressing decrease in the value of insulation resistance (IR) in the life test of the capacitor. Specifically, the present inventors noticed that there is a case that the decrease in insulation resistance is large despite the small degree of decrease in capacitance. In such a case, continuation of the life test would apparently lead rapid deterioration in performance due to exponential decrease in capacitance caused by decrease in insulation resistance. Therefore, it can be mentioned that the degree of decrease in capacitance is suited for evaluation of the degree of deterioration in the life test term, but, on the other front, is not suited for evaluation of the degree of progression of deterioration after the life test. Meanwhile, it can be mentioned that the decreasing rate of the insulation resistance is suited for evaluation of the degree of deterioration in the life test time, and is also suited for evaluation of the degree of progression of deterioration after the life test.

However, it has been unclear how the decrease in the insulation resistance in the life test can be suppressed.

The present invention was devised in light of the above-mentioned problem, and it is an object of the present invention to provide a polypropylene film suited for preparation of a capacitor capable of reducing the decreasing rate of the insulation resistance in the life test in the capacitor, and having the reliability of bearing the long-term use. It is another object of the present invention to provide a metal layer-integrated polypropylene film having a polypropylene film, and a film capacitor having a metal layer-integrated polypropylene film.

Means for Solving the Problems

The present inventors made diligent investigation to achieve the above objects, and finally accomplished the present invention.

The polypropylene film of the first aspect in the present invention has a crystallite size determined using Scherrer's equation from a full width at half maximum of the reflection peak from (040) plane of a crystal measured by a wide-angle X-ray diffraction method of 12.2 nm or less, and a volume resistivity calculated in accordance with Equation I from a current value 1 minute after applying a voltage at a potential gradient 200 V/μm in an environment of 100° C. of $6 \times 10^{14}$ Ω cm or more, the Equation I being Volume resistivity=[(effective electrode area)×(applied voltage)]/[(thickness of polypropylene film)×(current value)].

In the present invention and the present description, the terms "element", "capacitor", "capacitor element", and "film capacitor" respectively indicate the same one.

The reason of the small decreasing rate of the insulation resistance in the life test of the capacitor element prepared with the polypropylene film of the first aspect lies in the crystallite size of 12.2 nm or less, and the volume resistivity measured by the aforementioned method of $6 \times 10^{14}$ Ω cm or more. It is expected that the smaller the crystallite size, the smaller leakage current of the film capacitor due to its morphological effect. However, as a result of diligent investigation, the present inventors found that the leakage current of the film capacitor is not determined only by the crystallite size, but influenced by the volume resistivity when a voltage is applied to the polypropylene film with a very large potential gradient of 200 V/μm under a specific temperature. Here, the volume resistivity is one index indicating the easiness of leakage of the current in the polypropylene film, and the present inventors consider that the volume resistivity is deeply related with the internal structure of the molecule such as at least molecular arrangement as well as the crystallite size.

The method for measuring a volume resistivity for specifying the polypropylene film of the first aspect is excellent in accuracy. This will be described below.

Conventionally, in a general method for measuring a volume resistivity, as the accuracy of a measured value, digits is a credible value, and a numerical value that is more precise than digits (coefficient) is regarded as being within the range of error. When the volume resistivity of the polypropylene film is $3 \times 10^{14}$ Ω cm, the digits of the volume resistivity indicates $10^{14}$, and the coefficient (precise numerical value) indicates 3.

With regard to this, the present inventors specify the volume resistivity that is calculated from a current value 1 minute after applying a voltage at a potential gradient 200 V/μm in an environment of 100° C. according to the aforementioned Equation I, as part of the subject matter of the invention. The volume resistivity is a physical property that is obtained with a higher accuracy than the conventional digits level. In other words, the accuracy of the volume resistivity in the present invention covers not only the digits but also the coefficient. In the method for measuring a volume resistivity in the present invention, the constant potential gradient (200 V/μm in the present invention) is one reason for improvement in accuracy.

In general, the volume resistivity is constant within the range where the Ohm's law is applicable regardless of the applied voltage at the time of measurement. However, in the region where the Ohm's law is not applicable (high electric field region), the volume resistivity differs depending on the applied voltage. Specifically, the higher the voltage at the time of measurement (the higher the potential gradient is), the lower the resistance value is.

Since the volume resistivity is determined at a constant potential gradient in the present invention, it is possible to provide clearly different values for those having been evaluated as having almost the same volume resistivity because of the same digits in the conventional method when a plurality of kinds of films are measured for volume resistivity.

Meanwhile, it can be mentioned that the method for measuring a volume resistivity described in Patent Document 1 is low in accuracy. In Patent Document 1, a voltage of 100 V is applied for 1 minute, and a volume resistivity is calculated from a volume resistivity after 1 minute (see paragraph 0137). The film thickness is not taken into account at the time of application of voltage. For example, the film of Example 8 has a thickness of 2.3 μm, but the potential gradient is about 43.5 V/μm (100 V/2.3 μm). On the other hand, the film of Example 9 has a thickness of 5.8 μm, but the potential gradient is about 17.2 V/μm (100 V/5.8 μm). As described above, since the volume resistivity differs depending on the voltage at the time of measurement in the region where the Ohm's law is not applicable (high electric field region), it can be mentioned that the accuracy is low in the method for measuring a volume resistivity as described in Patent Document 1.

In the polypropylene film of the first aspect, it is preferred that the melting point of the first heating in the differential scanning calorimetry is 165° C. or more. When the melting point is 165° C. or more, the current is difficult to propagate, and the decreasing rate of the insulation resistance after the life test is kept low.

It is preferred that the polypropylene film of the first aspect is used for a capacitor. The polypropylene film of the first aspect can be suitably used for preparation of a capacitor having the reliability of bearing the long-term use because the decreasing rate of the insulation resistance in the life test in the capacitor can be made small.

It is preferred that the polypropylene film of the first aspect is a biaxially-oriented film. When the polypropylene film is a biaxially-oriented film, it is easy to obtain a polypropylene film that satisfies the aforementioned crystal size and the aforementioned volume resistivity.

In the polypropylene film of the first aspect, it is preferred that the total of the tensile strength in a first direction and the tensile strength in the direction perpendicular to the first direction is 450 to 600 MPa, the total of the elongation at break in the first direction and the elongation at break in the direction perpendicular to the first direction is 150 to 220%, and the total of the tensile modulus in the first direction and the tensile modulus in the direction perpendicular to the first direction is 5 to 10 GPa.

When the tensile strength falls within the aforementioned numerical range, the tensile strength under high temperature is also relatively large. Therefore, it is possible to suppress generation of a crack or the like even after a long-term use under high temperature. As a result, it is possible to desirably improve the long-term dielectric strength while keeping the effect of the small decreasing rate of the insulation resistance in the capacitor.

Also, when the elongation at break falls within the aforementioned numerical range, moderate elongation at break is provided in the two orthogonal directions, and defective stretching resulting from an unstretched part or left-to-draw part is controlled in the formation process. Therefore, excellent continuous producibility is realized while the effect of the small decreasing rate of the insulation resistance in the capacitor is kept.

When the tensile modulus falls within the aforementioned numerical range, the tensile modulus under high temperature is also relatively large. Therefore, it is possible to suppress generation of a crack or the like even after a long-term use under high temperature. As a result, it is possible to desirably improve the long-term dielectric strength while keeping the effect of the small decreasing rate of the insulation resistance in the capacitor.

The second aspect in the present invention relates to a metal layer-integrated polypropylene film. The metal layer-integrated polypropylene film of the second aspect has the polypropylene film of the first aspect, and a metal layer stacked on either face or both faces of the polypropylene film. Since the metal layer-integrated polypropylene film of the second aspect has a polypropylene film, the decreasing rate of the insulation resistance in the life test in the capacitor can be made small, and the metal layer-integrated polypropylene film is suitably used for preparation of a capacitor having the reliability of bearing the long-term use.

The third aspect in the present invention relates to a film capacitor. The film capacitor of the third aspect has a wound metal layer-integrated polypropylene film.

The fourth aspect in the present invention relates to use of the polypropylene film as a capacitor film. The use of the polypropylene film as a capacitor film of the fourth aspect is use of a polypropylene film having a crystallite size determined using Scherrer's equation from a full width at half maximum of the reflection peak from (040) plane of a crystal measured by a wide-angle X-ray diffraction method of 12.2 nm or less, and a volume resistivity calculated in accordance with Equation I from a current value 1 minute after applying a voltage at a potential gradient 200 V/μm in an environment of 100° C., the Equation I being Volume resistivity=[(effective electrode area)×(applied voltage)]/[(thickness of polypropylene film)×(current value)], as a capacitor film.

Effect of the Invention

Since the decreasing rate of the insulation resistance in the life test in the capacitor can be made small, the present invention is capable of providing a polypropylene film suited for preparation of a capacitor having the reliability of bearing the long-term use. The present invention is also capable of providing a metal layer-integrated polypropylene film having a polypropylene film, and a film capacitor having a metal layer-integrated polypropylene film.

MODE FOR CARRYING OUT THE INVENTION

Hereinafter, embodiments of the present invention are described. It is to be noted that the present invention is not limited only to these embodiments.

In this description, the wording of "comprising" and "include" involves the concepts of "comprise", "include", "consist essentially of" and "consist of".

The polypropylene film according to the present embodiment is not a microporous film, and hence does not have a great number of pores.

The polypropylene film according to the present embodiment may be made up of two or more layers, but is preferably made up of one layer.

The polypropylene film according to the present embodiment has a crystallite size determined using Scherrer's equation from a full width at half maximum of the reflection peak from (040) plane of a crystal measured by a wide-angle X-ray diffraction method of 12.2 nm or less, and a volume resistivity calculated in accordance with Equation I from a current value 1 minute after applying a voltage at a potential gradient 200 V/μm in an environment of 100° C. of $6 \times 10^{14}$ Ω cm or more. The Equation I is shown below.

Volume resistivity=[(effective electrode area)×(applied voltage)]/[(thickness of polypropylene film)×(current value)]

Here, letting volume resistivity be $R_v$ (Ω cm), effective electrode area be $A_E$ (cm$^2$), applied voltage be $V_A$ (V), thickness of polypropylene film be $T_F$ (cm), and current value be $C_E$ (A), $R_v = (A_E \times V_A) \div (T_F \times C_E)$ is satisfied.

The following is a detailed description for a method for measuring a volume resistivity. In the following description, measuring conditions that are not specifically described are in conformity with the JIS C 2139.

First, a jig for measurement of volume resistivity (hereinafter, also simply referred to as "jig") is arranged in a thermostatic bath in an environment of 100° C. The configuration of the jig for measurement of volume resistivity is as follows. Also a DC power source and a DC ammeter are connected to each electrode of the jig.

<Jig for measurement of volume resistivity>
Main electrode (50 mm in diameter)
Counter electrode (85 mm in diameter)
Ring-like guard electrode surrounding main electrode (80 mm in outer diameter, 70 mm in inner diameter).

Each electrode is made of gold-plated copper, and conductive rubber is pasted on the surface that is to be in contact with a sample. The conductive rubber used herein is EC-60BL (W300) that is available from Shin-Etsu Chemical Co., Ltd., and pasted so that the glossy surface of the conductive rubber is in contact with the gold-plated copper.

Next, a polypropylene film (hereinafter, also referred to as sample) is placed in an environment of 23° C., 50% RH for 24 hours. Thereafter, the sample is set in the jig in the thermostatic bath. Specifically, the main electrode and the guard electrode are brought into close contact with one surface of the polypropylene film, and the counter electrode is brought into close contact with the other surface, and the polypropylene film and the electrodes are brought into close contact with each other with a load of 5 kgf. Then the sample is left to stand for 30 minutes.

Next, a voltage is applied on the sample so that the potential gradient is 200 V/μm.

A current value is read 1 minute after application of voltage, and volume resistivity is calculated according to the following formula. For application of voltage, 2290-10 (DC power source) available from Keithley is used, and for measurement of a current value, 2635B (DC Picoammeter) available from Keithley is used.

Volume resistivity=[(effective electrode area)×(applied voltage)]/[(thickness of polypropylene film)×(current value)]

Here, the effective electrode area is determined according to the following formula.

(Effective electrode area)=π×[[[(inner diameter of main electrode)+(inner diameter of guard electrode)]/2]/2]$^2$ Here, letting effective electrode area be $A_E$ (cm$^2$), diameter of main electrode be $D_M$ (cm), and inner diameter of guard electrode be $D_G$ (cm), $A_E = \pi \times [\{(D_M + D_G) \div 2\} \div 2]^2$, or $A_E = \pi \times (D_M + D_G)^2 / 16$ is satisfied.

In the present embodiment, the area of the main electrode is not regarded as an effective electrode area, but the part located at the same distance or closer than the main electrode in the clearance part between the main electrode and the guard electrode is regarded as an effective electrode area. This enables more accurate measurement of current value.

The method for measuring volume resistivity in the present embodiment achieves higher accuracy compared with the digits level. The constant potential gradient (200 V/μm in the present embodiment) is one reason for improvement in accuracy. Further, in the present embodiment, since the area of the main electrode is not regarded as an effective electrode area, but the part located at the same distance or closer than the main electrode in the clearance part between the main electrode and the guard electrode is regarded as an effective electrode area, it is possible to measure a current value more accurately compared with the case where the area of the main electrode is regarded as an effective electrode area.

The polypropylene film has a volume resistivity of $6 \times 10^{14}$ Ω cm or more. The upper limit of the volume resistivity can be, for example, $1 \times 10^{16}$ Ω cm. The volume resistivity of the polypropylene film is preferably $8.0 \times 10^{14}$ Ω cm or more, more preferably $1.0 \times 10^{15}$ Ω cm or more. Also, the volume resistivity of the polypropylene film is preferably $5.0 \times 10^{15}$ Ω cm or less, more preferably $3.0 \times 10^{15}$ Ω cm or less, further preferably $2.0 \times 10^{15}$ Ω cm or less. When the volume resistivity is less than $6 \times 10^{14}$ Ω cm, it becomes difficult to make the decreasing rate of the insulation resistivity in the life test in the film capacitor small due to leakage of the current caused by the internal structure of the molecule (such as molecular arrangement).

The polypropylene film has a crystallite size of 12.2 nm or less. From the viewpoint of mechanical strength or the like, and in consideration of the thickness of lamellar of polymer chains (folded crystals), the lower limit of crystallite size is generally thought to be around 10 nm. The crystallite size is calculated according to Scherrer's equation from a full width at half maximum of the reflection peak from (040) plane of a crystal measured by a wide-angle X-ray diffraction method. The Scherrer's equation is shown below as formula (1).

[Mathematical formula 1]

$$D = K \times \lambda / (\beta \times \cos \theta) \quad (1)$$

In the formula (1), D indicates crystallite size (nm), K indicates constant (form factor), λ indicates wavelength of X-ray being used (nm), β indicates half value width, and θ indicates diffraction Bragg angle. As K, 0.94 is used. As λ, 0.15418 nm is used.

The crystallite size of the polypropylene film is preferably 10.5 nm or more, more preferably 11.0 nm or more, further preferably 11.5 nm or more. When the crystallite size is more than 12.2 nm, it becomes difficult to make the decreasing rate of the insulation resistivity in the life test in the film capacitor small due to leakage of the current caused by the morphology of crystals.

In the polypropylene film of the present embodiment, the combination of the requirement of the volume resistivity of $6 \times 10^{14}$ Ω cm or more, and the requirement of the crystallite size of 12.2 nm or less is important. In order to obtain the polypropylene film that satisfies the volume resistivity of $6 \times 10^{14}$ Ω cm or more, and the crystallite size of 12.2 nm or less, it is preferred to adjust the stretching angle of the tenter (hereinafter, referred to as "traverse stretching angle") to 8.5° to 14°, and it is more preferred to adjust the stretching temperature of the tenter (hereinafter, referred to as "traverse stretching temperature") to 156° C. or more and less than 160° C. in the biaxial stretching. The traverse stretching angle is preferably 8.5° or more, more preferably 9° or more. The traverse stretching angle is preferably 13° or less, more preferably 12° or less, further preferably 11° or less. When the traverse stretching angle is less than 8.5°, it becomes difficult to obtain the volume resistivity specified in the polypropylene film of the present embodiment. The traverse stretching temperature is preferably 157° C. or more, more preferably 158° C. or more. The traverse stretching temperature is preferably 159.5° C. or less, more preferably 159° C. or less. The traverse stretching angle is defined as follows.

<Traverse Stretching Angle>

When both ends of a first segment constituting the width of the polypropylene film at the starting point of traverse stretching are defined by a first end and a second end, both ends of a second segment constituting the width of the polypropylene film at the ending point of traverse stretching are defined by a third end and a fourth end, and the first end and the third end are defined to be located on either side of the reference virtual line extending along the machine direction from the middle point of the first segment, the angle formed by the first virtual line connecting the first end and the third end, and the second virtual line extending along the machine direction from the first end is defined as a traverse stretching angle.

The reason why the volume resistivity and the crystallite size can be adjusted by the stretching of tenter (hereinafter, referred to as "traverse stretching") would be that micronization of crystallite size occurs due to "breakage of crystals" and increase in anisotropy of molecular arrangement occurs due to the "rearrangement of crystals" as the strain increases in the traverse stretching process. This will be described below. Focusing on the traverse stretching process, the present inventors tracked the variation in crystallite size and the change in molecular arrangement in the traverse stretching process, and found that micronization of crystallite size progresses and the increase in anisotropy in molecular arrangement progresses as the strain increases. In the stretching process, as the increase in anisotropy in the molecular arrangement progressed, micronization of the crystallite size progressed although the crystallite size generally increases due to orientation crystallization. From this result, it is considered that "breakage of crystals" rather than orientation crystallization occurred.

It is considered that control of stretching energy is important to control the "breakage of crystals" and "rearrangement of crystals". The stretching energy can be estimated as an area determined by "stress s×time t" of the dynamic curve on the plane defined by time t on the horizontal axis, and stress s on the vertical axis.

The stretching energy can be controlled by the traverse stretching angle, the traverse stretching temperature, the stretch ratio, the kind of the polypropylene resin, physical properties of the polypropylene resin and the like. For example, as the traverse stretching angle decreases, the strain rate decreases, and the stress s on the polypropylene film decreases. The stress s increases as the traverse stretching temperature decreases.

Although the stretching energy relies not only on the traverse stretching angle, traverse stretching temperature and the like, but also on the conveyance speed of the polypropylene film in the traverse stretching process, it is not preferred to actively change the conveyance speed for adjustment of the stretching energy. This is because the conveyance speed largely influences on the operability such as yield and production efficiency.

Therefore, it is preferred to adjust the volume resistivity and the crystallite size within the ranges specified for the polypropylene film of the present embodiment by appropriately setting at least the traverse stretching angle and/or the traverse stretching temperature. As the traverse stretching temperature is elevated, the volume resistivity tends to decrease, and the crystallite size tends to increase. As the traverse stretching temperature is lowered, the volume resistivity tends to increase, and the crystallite size tends to decrease. As the traverse stretching angle is increased, the volume resistivity tends to increase, and the crystallite size also tends to increase. As the traverse stretching angle is decreased, the volume resistivity tends to decrease, and the crystallite size also tends to decrease. However, too small traverse stretching angle can change the tendency of the crystallite size, and result in increase in crystallite size.

Also it is preferred to adjust the volume resistivity and the crystallite size to fall within the ranges specified in the polypropylene film of the present embodiment by the surface temperature of the metal drum at the time of forming an unstretched cast sheet, the stretching temperature in the machine direction (longitudinal stretching temperature or longitudinal stretching temperature) and/or stretching magnification in the machine direction (longitudinal stretch ratio or longitudinal stretch ratio).

The surface temperature of the metal drum is preferably 105° C. or less, more preferably 100° C. or less. The surface temperature of the metal drum is preferably 95° C. or more. When the surface temperature of the metal drum is lower than 95° C., it can be difficult to obtain the volume resistivity and/or the crystallite size specified in the polypropylene film of the present embodiment.

The stretching temperature in the machine direction is preferably 127° C. to 139° C. When the stretching temperature in the machine direction is lower than 127° C. or higher than 139° C., it is difficult to obtain the crystallite size specified in the polypropylene film of the present embodiment. The stretch ratio in the machine direction is preferably 3.0 to 4.3 times. When the stretch ratio in the machine direction is higher than 4.3 times, it is difficult to obtain the crystallite size specified in the polypropylene film of the present embodiment.

The polypropylene film has an ash content of preferably 50 ppm or less, more preferably 40 ppm or less, further preferably 30 ppm or less.

It is preferred that the ash content is as small as possible to improve the electric characteristics. When the ash content in the polypropylene film is 35 ppm or less, more excellent electric characteristics are achieved.

In the polypropylene film, the melting point of the first heating in the differential scanning calorimetry is preferably 165° C. or more. When the melting point is 165° C. or more, the current is difficult to propagate, and the decreasing rate of the insulation resistance after the life test is small. The melting point is preferably 166° C. or more, more preferably 167° C. or more, further preferably 168° C. or more. The upper limit of the melting point is, for example, 178° C., preferably 177° C.

In the polypropylene film, the melting enthalpy of the first heating in the differential scanning calorimetry is preferably 90 J/g or more and 120 J/g or less, more preferably 92 J/g or more and 117 J/g or less, further preferably 95 J/g or more and 115 J/g or less.

The melting enthalpy of the polypropylene film of 90 J/g or more is preferred because the crystal is rigid. On the other hand, when the melting enthalpy is 89 J/g or less, the heat resistance of the capacitor significantly decreases.

The melting point and the melting enthalpy can be determined by cutting out a sample of 5 mg from the polypropylene film, enclosing the sample in the aluminum pan, and performing power compensation differential scanning calorimetry with a differential scanning calorimeter (Diamond DSC available from PerkinElmer Co.). In measurement, the temperature is elevated from 30° C. to 280° C. at 20° C./minute (first run) in a nitrogen atmosphere.

The polypropylene film has a thickness of preferably within the range of 0.5 to 22 μm, more preferably within the range of 0.8 to 10 μm, still more preferably within the range of 0.9 to 7 μm, further preferably within the range of 1 to 5 μm, still further preferably within the range of 1.1 to 3 μm, especially preferably within the range of 1.2 to 2.9 μm. In particular, when the thickness of polypropylene film falls within the range of 1.1 to 3 μm or 1.2 to 2.9 μm, excellent capacitance is obtained when the polypropylene film is made into a capacitor element because the polypropylene film is a thin film, and the effect of reducing the insulation resistance in the life test in the capacitor despite the thin film, and having the reliability of bearing the long-term use is exerted. Therefore, the thickness within this range is a preferred form.

When the thickness is 22 μm or less, it is possible to increase the capacitance, and thus such a polypropylene film is suitably used for a capacitor. From the viewpoint of production, the thickness may be set to be 0.5 μm or more.

The thickness of the polypropylene film means a value measured in accordance with JIS-C2330 except that the measurement is performed at 100±10 kPa using a paper thickness measuring device MEI-11, available from Citizen Seimitsu Co., Ltd.

The polypropylene film contains a polypropylene resin. The content of the polypropylene resin is preferably 90% by mass or more, more preferably 95% by mass or more, relative to the entire polypropylene film (when the entire polypropylene film is 100% by mass). The upper limit of the content of the polypropylene resin is, for example, 100% by mass, 98% by mass and so on, relative to the entire polypropylene film. The polypropylene resin may contain one kind of polypropylene resin singly, or may contain two or more kinds of polypropylene resin. The polypropylene resin contained in the polypropylene film is preferably a homopolypropylene resin.

Here, when two or more kinds of polypropylene resin are contained in the polypropylene film, the polypropylene resin contained in a larger content is referred to as "main polypropylene resin" in this description. When one kind of polypropylene resin is contained in the polypropylene film, the polypropylene resin is referred to as "main polypropylene resin" in this description.

Hereinafter, by the term "polypropylene resin" mentioned in the description without any specific notation regarding whether it is a main ingredient or not, both the "polypropylene resin" as a main ingredient and the "polypropylene resin" other than a main ingredient are meant unless otherwise specified. For example, when there is a description "the weight average molecular weight Mw of the polypropylene resin is preferably 250,000 or more and 450,000 or less", it means both the weight average molecular weight Mw of the polypropylene resin as a main ingredient being preferably 250,000 or more and 450,000 or less, and the weight average molecular weight Mw of the polypropylene resin other than a main ingredient being preferably 250,000 or more and 450,000 or less.

The weight average molecular weight Mw of the polypropylene resin is preferably 250,000 or more and 450,000 or less, more preferably 250,000 or more and 400,000 or less. When the weight average molecular weight Mw of the polypropylene resin is 250,000 or more and 450,000 or less, the resin fluidity is moderate. As a result, the thickness of the cast sheet can be easily controlled, and a thin stretched film can be easily prepared. Also it is possible to provide the cast sheet with moderate stretchability. When two or more kinds of polypropylene resin are used, it is preferred to use a combination of a polypropylene resin having the Mw of 250,000 or more and less than 345,000, and a polypropylene resin having the Mw of 345,000 or more and 450,000 or less.

The molecular weight distribution of polypropylene resin [(weight average molecular weight Mw)/(number average molecular weight Mn)] is preferably 5 or more and 12 or less, more preferably 5 or more and 11 or less, further preferably 5 or more and 10 or less.

The molecular weight distribution of polypropylene resin [(z average molecular weight Mz)/(number average molecular weight Mn)] is preferably 10 or more and 70 or less, more preferably 15 or more and 60 or less, further preferably 15 or more and 50 or less.

In the present description, the weight average molecular weight (Mw), the number average molecular weight (Mn), the z average molecular weight, and the molecular weight distribution (Mw/Mn, and Mz/Mn) of polypropylene resin are values measured by using a gel permeation chromatograph (GPC) device. More specifically, they are values measured by using HLC-8121GPC-HT (trade name) available from TOSOH CORPORATION, which is a high temperature GPC measuring machine incorporating a differential refractometer (RI). As a GPC column, three TSKgel GMHHR-H(20)HT available from TOSOH CORPORATION are connected and used. Measured values of Mw and Mn are obtained by setting the column temperature at 140° C., and flowing trichlorobenzene as an eluate at a flow rate of 1.0 ml/10 min. A calibration curve regarding molecular weight M is prepared by using standard polystyrene available from TOSOH CORPORATION, and measured values are converted into polystyrene values to obtain Mw, Mn and Mz. Here, the logarithm with base 10 of molecular weight M of the standard polystyrene is called a logarithmic molecular weight ("Log(M)").

Regarding polypropylene resin, a difference obtained by subtracting a differential distribution value at Log(M)=6.0 from a differential distribution value at Log(M)=4.5 in the molecular weight differential distribution curve is preferably −5% or more and 14% or less, more preferably −4% or more and 12% or less, further preferably −4% or more and 10% or less, on the basis of a differential distribution value at Log(M)=6.0 being 100% (basis).

By the expression "a difference obtained by subtracting a differential distribution value at Log(M)=6.0 from a differential distribution value at Log(M)=4.5 is −5% or more and 14% or less", it can be understood that a lower molecular weight component is larger in quantity if the difference is positive, and a higher molecular weight component is larger in quantity if the difference is negative, when a component of a logarithmic molecular weight Log(M)=4.5 as a representative distribution value of a component having a molecular weight of 10,000 to 100,000 on the lower molecular weight side (hereinafter, also referred to as "lower molecular weight component"), and a component around Log(M)=6.0 as a representative distribution value of a component having a molecular weight of around 1,000,000 on the higher molecular weight side (hereinafter, also referred to as "higher molecular weight component") are compared with each other from the values of Mw possessed by the polypropylene resin.

That is, the molecular weight distribution of Mw/Mn being 5 to 12 merely indicates the breadth of the molecular weight distribution width, and the quantitative relation between the higher molecular weight component and the lower molecular weight component therein is not recognized. From the viewpoint of stable film formability and uniformity in thickness of cast sheet, it is preferred to use a component having a molecular weight of 10,000 to 100,000 so that the differential distribution value difference is −5% or more and 14% or less, compared with a component having a molecular weight of 1,000,000 in the polypropylene resin so that the polypropylene resin has a wide molecular weight distribution and appropriately contains a lower molecular weight component.

The differential distribution value is a value obtained in the following manner by using GPC. A curve indicating the intensity versus time (generally, also called "elution curve") obtained by the differential refractometer (RI) detector of GPC is used. By converting the time axis to the logarithmic molecular weight (Log(M)) by using the calibration curve obtained by using standard polystyrene, the elution curve is converted into a curve indicating intensity versus Log(M). Since the RI detection intensity is proportional to the component concentration, an integral distribution curve for the logarithmic molecular weight Log(M) can be obtained letting the total area of the curve indicating intensity be 100%. The differential distribution curve is obtained by differentiating the integral distribution curve by Log(M). Therefore, "differential distribution" means differential distribution of concentration fraction with respect to the molecular weight. From this curve, a differential distribution value at a specific Log(M) is read out.

Heptane insolubles (HI) of the polypropylene resin is preferably 96.0% or more, more preferably 97.0% or more. Heptane insolubles (HI) of the polypropylene resin is preferably 99.5% or less, more preferably 99.0% or less. Here, the more the heptane insolubles, the higher the stereoregularity of the resin is meant. When the heptane insolubles (HI) are 96.0% or more and 99.5% or less, the crystallinity of the resin moderately improves owing to the moderately high stereoregularity, and the dielectric strength under high temperature improves. On the other hand, the speed of the solidification (crystallization) at the time of cast sheet formation moderates, and moderate stretchability is provided.

The mesopentad fraction ([mmmm]) of the polypropylene resin is preferably 94.0% or more, more preferably 95.0% or more. The mesopentad fraction of the polypropylene resin is preferably 97.5% or less, more preferably 97.0% or less. By using such a polypropylene resin, the crystallinity of the resin moderately improves owing to the moderately high stereoregularity, and the initial dielectric strength and the dielectric strength over a long term improve. On the other hand, it is possible to obtain desired stretchability by a moderate solidification (crystallization) speed at the time of forming a cast sheet.

The mesopentad fraction ([mmmm]) is an index for stereoregularity that can be obtained by high temperature nuclear magnetic resonance (NMR) measurement. In the present description, a mesopentad fraction ([mmmm]) refers to a value measured by using a high temperature type Fourier transformation nuclear magnetic resonance apparatus (high temperature FT-NMR) JNM-ECP500, available from JEOL Ltd. Observation nuclear is 13C (125 MHz), measurement temperature is 135° C., and as a solvent for dissolving polypropylene resin, ortho-dichlorobenzene (mixed solvent of ODCB:ODCB and deuterated ODCB (mixing ratio=4/1) is used. The measuring method by high temperature NMR can be performed, for example, by referring to the method described in "Kobunshi Bunseki Handbook, New edition, The Japan Society for Analytical chemistry ed., KINOKUNIYA COMPANY LTD, 1995, p. 610".

The measurement mode is a single pulse proton broadband decoupling, the pulse width is 9.1 μsec (45° pulse), the pulse interval is 5.5 sec, the number of times of integration is 4500, and the shift basis is $CH_3$ (mmmm)=21.7 ppm.

The pentad fraction indicating the stereoregularity is calculated in percentage based on the integrated value of intensity of each signal derived from combination of pentad of isotactic diad "meso (m)" and syndiotactic diad "racemo (r)" (mmmm and mrrm and the like). Respective signals derived from mmmm and mrrm and the like can be attributed by referring to, for example, "T. Hayashi et al., Polymer, vol. 29, p. 138 (1988)" and so on. A more specific measuring method of mesopentad fraction ([mmmm]) follows the method described in Examples.

The melt flow rate (MFR) of the polypropylene resin is preferably 1.0 to 8.0 g/10 min, more preferably 1.5 to 7.0 g/10 min, further preferably 2.0 to 6.0 g/10 min. A method for measuring melt flow rate of the polypropylene resin follows the method described in Examples.

When two or more kinds of polypropylene resin are contained in the polypropylene film, it is preferred that the main polypropylene resin at least has a weight average molecular weight Mw of 250,000 or more and less than 345,000, and MFR of 4 to 8 g/10 min. Also, when two or more kinds of polypropylene resin are contained in the polypropylene film, it is preferred that the main polypropylene resin at least has a weight average molecular weight Mw of 345,000 or more and 450,000 or less, and MFR of 1 g/10 min or more and less than 4 g/10 min (further preferably, 1 g/10 min or more and 3.9 g/10 min or less).

The polypropylene resin can be produced by using a generally known polymerization method. Examples of the polymerization method include gas-phase polymerization, block polymerization, and slurry polymerization.

Polymerization may be a single-step (on step) polymerization using one polymerization reactor, or may be a multi-step polymerization using two or more polymerization reactors. Also, polymerization may be performed while hydrogen or comonomer is added as a molecular weight regulator in the reactor.

As a catalyst in polymerization, a generally known Ziegler-Natta catalyst can be used, and the catalyst is not particularly limited as long as a polypropylene resin can be obtained. The catalyst may contain a catalyst promoter component or a donor. By adjusting the catalyst and the polymerization conditions, it is possible to control the molecular weight, molecular weight distribution, stereoregularity and the like.

The molecular weight distribution or the like of the polypropylene resin can be adjusted by mixing (blending) of resin. For example, a method of mixing two or more kinds of resin having different molecular weights and different molecular weight distributions can be recited. In general, a mixed system of two kinds of propylene containing 55% by mass or more and 90% by mass or less of a main resin, and a resin having a higher average molecular weight than the main resin, or a resin having a lower average molecular weight than the main resin, in 100% by mass of the entire resin is preferred because the amount of the lower molecular weight component can be easily adjusted.

When the mixing adjusting method is employed, melt flow rate (MFR) may be used as a standard for average molecular weight. In this case, it is preferred that the difference in MFR between the main resin and the additional resin is about to 1 to 30 g/10 min from the viewpoint of the convenience in the adjustment.

Examples of the method for mixing resins include, but are not particularly limited to, a method of dry blending polymerization powder or pellets of the main resin and the additional resin with a mixer or the like, and a method of supplying a kneader with polymerization powder or pellets of the main resin and the additional resin, and melt kneading the polymerization powder or pellets to obtain a blended resin.

The mixer or the kneader is not particularly limited. The kneader may be of a monoaxial screw type, a biaxial screw type, or a multiaxial (tri- or more axial) screw type. In the case of the bi- or more axial screw type, the kneading type may be co-rating or counter-rotating.

In the case of blending by melt kneading, the kneading temperature is not particularly limited as long as a satisfactory kneaded matter is obtained. The kneading temperature is generally in the range of 200° C. to 300° C., and is preferably in the range of 230° C. to 270° C. from the viewpoint of suppressing deterioration of the resin. The kneader may be purged with an inert gas such as nitrogen so as to suppress deterioration of the resin during the mixing by kneading. The melt-kneaded resin may be pelletized into an appropriate size by using a known granulator. Thus, mixed polypropylene raw material resin pellets can be obtained.

It is preferred that the total ash originating in a polymerization catalyst residue or the like contained in the polypropylene raw material resin is as small as possible so as to improve the electric characteristics. The total ash is preferably 50 ppm or less, more preferably 40 ppm or less, especially preferably 30 ppm or less on the basis of the polypropylene resin (100 parts by weight).

The polypropylene resin may contain an additive. Examples of the additive include an antioxidant, a chlorine absorber, an ultraviolet ray absorber, a lubricant, a plasticizer, a flame retarder, and an antistatic agent. The polypropylene resin may contain an additive in such an amount that will not adversely affect on the polypropylene film.

The polypropylene film may contain other resin other than the polypropylene resin (hereinafter, also referred to as "other resin"). Examples of the other resin include polyolefins other than polypropylene such as polyethylene, poly(1-butene), polyisobutene, poly(1-pentene), poly(1-methylpentene); copolymers of α-olefins such as an ethylene-propylene copolymer, propylene-butene copolymer, or ethylene-butene copolymer; vinyl monomer-diene monomer random copolymers such as a styrene-butadiene random copolymer; and vinyl monomer-diene monomer-vinyl monomer random copolymers such as a styrene-butadiene-styrene block copolymer. The polypropylene film may contain the other resin as described above in such a range of amount that will not adversely affect on the polypropylene film.

When the polypropylene film is a biaxially-oriented polypropylene film, a cast sheet before stretching for producing a biaxially-oriented polypropylene film can be prepared in the following manner.

First, the extruder is supplied with polypropylene resin pellets, dry-mixed polypropylene resin pellets, or mixed polypropylene resin pellets prepared in advance by melt-kneading, and the pellets are melted under heating.

The number of rotations of the extrude at the time of heat melting is preferably 5 to 40 rpm, more preferably 10 to 30 rpm. The setting temperature of the extruder at the time of heat melting is preferably 220 to 280° C., more preferably 230 to 270° C. The resin temperature at the time of heat melting is preferably 220 to 280° C., more preferably 230 to 270° C. The resin temperature at the time of heat melting is a value measured by a thermometer inserted into the extruder.

The number of rotations of the extruder, the setting temperature of the extruder, and the resin temperature at the time of heat melting are selected in consideration of physical properties of the crystalline thermoplastic resin being used. By setting the resin temperature at the time of heat melting within such a numerical range, it is also possible to suppress deterioration of the resin.

Next, the melt resin is extruded into a sheet-like shape by using a T-die, and cooled to be solidified with at least one metal drum (also referred to as cast drum) to form an unstretched cast sheet.

As described above, the surface temperature of the metal drum (the temperature of the metal drum with which the sheet first comes into contact after extrusion) is preferably 105° C. or less, more preferably 100° C. or less. The surface temperature of the metal drum is preferably 95° C. or more. The surface temperature of the metal drum can be determined depending on the physical properties and the like of the polypropylene resin being used.

The melt flow rate (MFR) of the cast sheet is preferably 1.0 to 9.0 g/10 min, more preferably 2.0 to 8.0 g/10 min, further preferably 3.0 to 7.0 g/10 min.

The thickness of the cast sheet is not particularly limited as long as the polypropylene film can be obtained, and typically, the thickness is preferably 0.05 mm to 2 mm, more preferably 0.1 mm to 1 mm.

The polypropylene film can be produced by performing a stretching process on a polypropylene cast sheet. The stretching is preferably biaxial stretching that makes the film be oriented biaxially in the longitudinal direction and the traverse direction, and as a method for stretching, a sequential biaxial stretching method is preferred. In the sequential biaxial stretching method, for example, first, the cast sheet is kept at a temperature of 127 to 145° C., and caused to pass between rolls with different speeds to be stretched to 3 to 4.3 times in the machine direction as described above. Subsequently, the sheet is guided to the tenter, and stretched to 3 to 11 times in the cross direction. Thereafter, the sheet is relaxed to 2 to 10 times and subjected to thermosetting. In this manner, a biaxially-oriented polypropylene film is obtained.

In the biaxially-oriented polypropylene film of the present embodiment, the total of the tensile strength in the first direction and the tensile strength in the direction perpendicular to the first direction is preferably 450 MPa or more, more preferably 470 MPa or more, further preferably 480 MPa or more. The total of the tensile strength in the first direction and the tensile strength in the direction perpendicular to the first direction is preferably 600 MPa or less, more preferably 570 MPa or less, further preferably 530 MPa or less, especially preferably 525 MPa or less.

In the present description, the first direction is intended to the MD direction (machine direction) of the biaxially-oriented polypropylene film. That is, in the present embodiment, the first direction is preferably the MD direction. However, in the present embodiment, the first direction is not limited to the MD direction, and any direction may be selected as the first direction.

In the following, description is given for the case where the first direction is the MD direction. The direction perpendicular to the MD direction in the present description is a TD direction (transverse direction)(also referred to as "width direction, cross direction").

In the biaxially-oriented polypropylene film of the present embodiment, the total ($T_{MD}+T_{TD}$) of the tensile strength in the MD direction ($T_{MD}$), and the tensile strength in the TD direction ($T_{TD}$) is preferably 450 MPa or more, more preferably 470 MPa or more, further preferably 480 MPa or more. Here, the tensile strength of the polypropylene film in the present embodiment is a value obtained by a measuring method described in Examples. The total ($T_{MD}+T_{TD}$) of the tensile strength of the polypropylene film in the present embodiment is preferably 600 MPa or less, more preferably 570 MPa or less, further preferably 530 MPa or less, especially preferably 525 MPa or less. When the total of the tensile strength in the MD direction and the tensile strength in the TD direction of the polypropylene film at a measuring temperature of 23° C. (described in JIS-C2151) falls within each of the above preferred ranges, the tensile strength under high temperature is also relatively large. Therefore, it is possible to suppress generation of a crack or the like even after a long-term use under high temperature. As a result, it is possible to desirably improve the long-term dielectric strength while keeping the effect of the present embodiment of the small decreasing rate of the insulation resistance in the capacitor.

The ratio ($T_{TD}/T_{MD}$) of the tensile strength in the TD direction to the tensile strength in the MD direction of the tensile strength of the polypropylene film in the present embodiment is preferably 2.00 or less, more preferably 1.80 or less, further preferably 1.70 or less, especially preferably 1.58 or less. $T_{TD}/T_{MD}$ is more preferably 1.10 or more, further preferably 1.50 or more. When $T_{TD}/T_{MD}$ falls within each of the preferred ranges, the tensile strength is relatively well-balanced in the orthogonal two directions, and the tensile strength in the width direction is large. Therefore, defective stretching resulting from an unstretched part or left-to-draw part is controlled in the formation process, and excellent continuous producibility is realized while the effect of the present embodiment of the small decreasing rate of the insulation resistance in the capacitor is kept.

In the biaxially-oriented polypropylene film of the present embodiment, the total ($E_{MD}+E_{TD}$) of the elongation at break in the MD direction ($E_{MD}$), and the elongation at break in the TD direction ($E_{TD}$) is preferably 150% or more, more preferably 160% or more, further preferably 170% or more. Here, the elongation at break of the polypropylene film in the present embodiment is a value obtained by a measuring method described in Examples. The total ($E_{MD}+E_{TD}$) of the elongation at break of the polypropylene film in the present embodiment is preferably 220% or less, more preferably 200% or less, further preferably 190% or less, especially preferably 185% or less. When the total of the elongation at break in the MD direction and the elongation at break in the TD direction of the polypropylene film at a measuring temperature of 23° C. (described in JIS-K7127) falls within each of the preferred ranges, moderate elongation at break is provided in the two orthogonal directions, and defective stretching resulting from an unstretched part or left-to-draw part is controlled in the formation process. Therefore, excellent continuous producibility is realized while the effect of the present embodiment of the small decreasing rate of the insulation resistance in the capacitor is kept.

The ratio ($E_{TD}/E_{MD}$) of the elongation at break in the TD direction to the elongation at break in the MD direction of the elongation at break of the polypropylene film in the present embodiment is preferably 0.70 or less, more preferably 0.60 or less, especially preferably 0.50 or less. $E_{TD}/E_{MD}$ is preferably 0.20 or more, more preferably 0.30 or more, further preferably 0.35 or more. When $E_{TD}/E_{MD}$ falls within each of the preferred ranges, defective molding in preparation of a capacitor element is suppressed due to the relatively well-balanced elongations at break in the orthogonal two directions, and it is easy to keep the gap between film layers. As a result, it is possible to desirably improve the long-term dielectric strength while keeping the effect of the present embodiment of the small decreasing rate of the insulation resistance in the capacitor.

In the biaxially-oriented polypropylene film of the present embodiment, the total ($M_{MD}+M_{TD}$) of the tensile modulus in the MD direction ($M_{MD}$), and the tensile modulus in the TD direction ($M_{TD}$) is preferably 5 GPa or more, more preferably 5.2 GPa or more. Here, the tensile modulus of the polypropylene film in the present embodiment is a value obtained by a measuring method described in Examples. The total $M_{MD}+M_{TD}$) of the tensile modulus of the polypropylene film in the present embodiment is preferably 10 GPa or less, more preferably 8 GPa or less, further preferably 7.5 GPa or less. When the total of the tensile modulus in the MD direction and the tensile modulus in the TD direction of the polypropylene film at a measuring temperature of 23° C. (described in JIS-K7127) falls within each of the above preferred ranges, the tensile modulus under high temperature is also relatively large. Therefore, it is possible to suppress generation of a crack or the like even after a long-term use under high temperature. As a result, it is possible to desirably improve the long-term dielectric strength while keeping the effect of the present embodiment of the small decreasing rate of the insulation resistance in the capacitor.

The ratio ($M_{TD}/M_{MD}$) of the tensile modulus in the TD direction to the tensile modulus in the MD direction of the tensile modulus of the polypropylene film in the present embodiment is preferably 2.0 or less, preferably 1.9 or less, more preferably 1.7 or less, further preferably 1.6 or less. $M_{TD}/M_{MD}$ is preferably 1.0 or more, more preferably 1.1 or more. When $M_{TD}/M_{MD}$ falls within each of the preferred ranges, the tensile modulus is relatively well-balanced in the orthogonal two directions, and the tensile modulus in the width direction is large. Therefore, defective stretching resulting from an unstretched part or left-to-draw part is controlled in the formation process, and excellent continuous producibility is realized while the effect of the present embodiment of the small decreasing rate of the insulation resistance in the capacitor is kept.

The polypropylene film may be subjected to a corona discharge treatment on-line or off-line in a postprocessing step such as a metal vapor deposition processing step after end of the stretching and thermosetting steps so as to improve the adhesion characteristics. The corona discharge treatment can be performed using a known method. It is preferred to use air, carbon dioxide gas, nitrogen gas, or a mixed gas thereof as an atmospheric gas.

For processing as a capacitor, a metal layer may be stacked on either face or both faces of the polypropylene film to give a metal layer-integrated polypropylene film. The metal layer functions as an electrode. Examples of the metal that can be used for the metal layer include elemental metals such as zinc, lead, silver, chromium, aluminum, copper, and nickel; mixtures of a plurality of kinds of the elemental metals, and alloys thereof, however, from the viewpoint of environment, economy and capacitor performance and the like, zinc or aluminum is preferred.

As a method for stacking a metal layer on either face or both faces of the polypropylene film, for example, a vacuum vapor deposition method or a sputtering method can be exemplified. From the viewpoint of producibility and economy, the vacuum vapor deposition method is preferred. As the vacuum vapor deposition method, a crucible method or a wire method can be generally exemplified, however, the method is not particularly limited, and any suitable method can be appropriately selected.

While the margin pattern in stacking a metal layer by vapor deposition is not particularly limited, it is preferred to apply a pattern including a so-called special margin such as a fish net pattern or a T margin pattern, on either face of the film from the viewpoint of improving the characteristics such as safety of the capacitor. This improves the safety, and is also effective in terms of prevention of breakage of the capacitor, a short circuit and so on.

As a method for forming a margin, a generally known method such as a tape method, or an oil method can be used without any limitation.

The metal layer-integrated polypropylene film can be made into a film capacitor by stacking or winding according to a known method.

The decreasing rate of the insulation resistance in the film capacitor is preferably 60% or less, more preferably 55% or less, further preferably 50% or less. The decreasing rate of the insulation resistance is preferably smaller, and may be for example, 10% or more, or 30% or more. The decreasing rate of the insulation resistance is a value calculated according to the following formula. The method for measuring the insulation resistance, and the method of the life test are as follows.

<Method for Measuring Decreasing Rate of Insulation Resistance in Capacitor>

An insulation resistance of a capacitor is evaluated by using an ultra insulation resistance meter DSM8104 available from HIOKI E. E. CORPORATION. The decreasing rate of the insulation resistance is determined by the following procedure. After leaving the capacitor to stand at 23° C. for 24 hours, a voltage is applied with a potential gradient of 200 V/μm (500 V when the thickness of the film is 2 μm or more) to the capacitor, and an insulation resistance 1 minute after application is measured. The measured value is an insulation resistance before life test (hereinafter, also referred to as "$IR_0$"). Next, the capacitor is detached from the ultra insulation resistance meter, and a voltage is continuously applied (loaded) to the capacitor with a potential gradient of DC 280 V/μm by a DC high voltage power supply for 1000 hours in a temperature controlled bath at 105° C. After a lapse of 1000 hours, the capacitor is detached, and then a discharging resistance is connected with the capacitor to eliminate static charges. Next, the capacitor is left to stand at 23° C. for 24 hours, and then an insulation resistance of the element (hereinafter, also referred to as "$IR_{1000}$") is measured, and a decreasing rate of the insulation resistance is calculated. The decreasing rate of the insulation resistance is evaluated by a mean value of two capacitors.

[Decreasing rate of insulation resistance (%)]=[[(insulation resistance before life test)−(insulation resistance after life test)]/((insulation resistance before life test)]×100

The decreasing rate of the insulation resistance (also referred to as IR decreasing rate)(%) is also expressed by [($IR_0-IR_{1000}$)/$IR_0$]×100(%). Here, "/" means "÷", and other "/" used in this description can also mean "÷".

The rate of change in capacitance in the film capacitor after a lapse of 1000 hours is preferably within the range of −5% or more and 0% or less, more preferably −0.1% or less.

<Method for Measuring Rate of Change in Capacitance ΔC in Film Capacitor After Lapse of 1000 Hours>

The capacitance of the capacitor is measured by using an LCR HiTESTER 3522-50 (frequency 1 kHz) available from HIOKI E. E. CORPORATION. The rate of change in capacitance is determined by the following procedure. After leaving the capacitor to stand at 23° C. for 24 hours, an initial capacitance before life test (hereinafter, also referred to as "$C_0$") is measured. Next, the capacitor is detached from the LCR HiTESTER 3522-50, and a voltage is continuously applied (loaded) to the capacitor with a potential gradient of DC 280 V/μm by a DC high voltage power supply for 1000 hours in a temperature controlled bath at 105° C. After a lapse of 1000 hours, the capacitor is detached, and then a discharging resistance is connected with the capacitor to eliminate static charges. Next, the capacitor is left to stand at 23° C. for 24 hours, and then a capacitance of the element (hereinafter, also referred to as "$C_{1000}$") is measured, and a rate of change in capacitance is calculated. The rate of change in capacitance ΔC is [($C_{1000}$-$C_0$)/$C_0$]×100(%). The rate of change in capacitance is evaluated by a mean value of two capacitors.

EXAMPLES

In the following, the present invention is described more specifically by examples, however, it is to be noted that these examples are given for explaining the present invention, and do not limit the present invention in any way. The "part" and "%" in examples indicate "part by mass" and "% by mass", respectively, unless otherwise specified.

<Measurement of Weight Average Molecular Weight (Mw), Molecular Weight Distribution (Mw/Mn), and Molecular Weight Distribution (Mz/Mn) and Differential Distribution Value of Polypropylene Resin>

Measurement and calculation were performed in the following conditions using GPC (gel permeation chromatography).

Measurement device: a differential refractometer (RI)-incorporated high temperature GPC model HLC-8121GPC/HT, available from TOSOH CORPORATION.

Column: three connected TSKgel GMHhr-H(20)HT available from TOSOH CORPORATION.

Column temperature: 145° C.
Eluent: trichlorobenzene
Flow rate: 1.0 ml/min

A calibration curve was prepared by using standard polystyrene available from TOSOH CORPORATION, and a measured value of molecular weight was converted into a value of polystyrene, and thus a Z average molecular weight (Mz), an weight average molecular weight (Mw) and a number average molecular weight (Mn) were obtained. A molecular weight distribution (Mz/Mn) was obtained using the values of Mz and Mn, and a molecular weight distribution (Mw/Mn) was obtained using the values of Mw and Mn.

A differential distribution value was obtained by the following method. First, a time curve (elution curve) of intensity distribution detected by using the RI detector was converted into a distribution curve for molecular weight M (Log(M)) of standard polystyrene using the calibration curve prepared by using standard polystyrene. Next, an integral distribution curve for Log(M) when the total area of the distribution curve was 100% was obtained, and then the integral distribution curve was differentiated by Log(M), and thus a differential distribution curve for Log(M) was obtained. From this differential distribution curve, differential distribution values at Log(M)=4.5 and Log(M)=6.0 were read out. The series of operations for obtaining the differential distribution curve was performed with analytical software incorporated in the GPC measuring apparatus being used.

<Mesopentad Fraction>

Polypropylene resin was dissolved in a solvent, and measurement was performed in the following conditions by using a high temperature type Fourier transformation nuclear magnetic resonance apparatus (high temperature FT-NMR).

High temperature type nuclear magnetic resonance (NMR) apparatus: high temperature type Fourier transformation nuclear magnetic resonance apparatus (high temperature FT-NMR), JNM-ECP500, available from JEOL Ltd.

Observation nuclear: 13C (125 MHz)
Measurement temperature: 135° C.
Solvent: ortho-dichlorobenzene (mixed solvent of ODCB: ODCB and deuterated ODCB (mixing ratio=4/1)
Measurement mode: single pulse proton broadband decoupling
Pulse width: 9.1 μsec (45° pulse)
Pulse interval: 5.5 sec
Number of times of integration: 4,500
Shift basis: CH3 (mmmm)=21.7 ppm The pentad fraction indicating the stereoregularity was calculated in percentage (%) based on the integrated value of intensity of each signal derived from combination of pentad of isotactic diad "meso (m)" and syndiotactic diad "racemo (r)" (mmmm, mrrm and the like). Regarding attribution of each signal derived from mmmm, mrrm and the like, for example, description of spectrum in "T. Hayashi et al., Polymer, vol. 29, p. 138 (1988)" and so on were referenced.

<Thickness of Film>

The thickness of a biaxially-oriented polypropylene film was measured in accordance with JIS-C2330 except that the measurement was performed at 100±10 kPa using a paper thickness measuring device MEI-11, available from Citizen Seimitsu Co., Ltd.

<Measurement of Melt Flow Rate (MFR)>

For each resin, melt flow rate (MFR) in the form of a raw material resin pellet was measured in accordance with the condition M of JIS K 7210 using a melt indexer available from TOYO SEIKI Co., Ltd. Specifically, 4 g of sample was inserted into a cylinder set to a test temperature of 230° C., and preheated for 3.5 minutes under a load of 2.16 kg. Then, the weight of the sample extruded through the bottom hole in 30 seconds was measured, and MFR (g/10 min) was determined. The aforementioned measurement was repeated three times, and a mean value was determined as a measured value of MFR.

<Crystallite Size>

Evaluation of the crystallite size of a biaxially-oriented polypropylene film was performed in the following manner using an XRD (wide angle X-ray diffraction) apparatus.

Measuring machine: desktop X-ray diffraction apparatus MiniFlex 300 available from Rigaku Corporation.

X-ray generation output: 30 KV, 10 mA
Irradiated X-ray: monochromator monochrome CuKα ray (wavelength 0.15418 nm)
Detector: scintillation counter
Goniometer scanning: 2θ/θ ganged scanning From the obtained data, a half value width of a diffraction reflection peak in the a crystal (040) face was calculated using an analytical computer and integrated powder X-rays analysis software PDXL regularly attached to the apparatus. From the obtained half value width of a diffraction reflection peak in the a crystal (040) face, a crystallite size was determined by using the Scherrer's equation (D=Kxλ/(β× Cos θ)). In the Scherrer's equation, D indicates crystallite size (nm), K indicates constant (form factor), λ indicates wavelength of X-ray being used (nm), β indicates a determined half value width, and θ indicates diffraction Bragg angle. As K, 0.94 was adopted.

<Measurement of Volume Resistivity>

While a specific measuring procedure of volume resistivity is shown below, the measurement was performed in accordance with JIS C 2139 for the conditions that are not specifically described.

First, a jig for measurement of volume resistivity (hereinafter, also simply referred to as "jig") was arranged in a thermostatic bath in an environment of 100° C. The configuration of the jig for measurement of volume resistivity is as follows. Also a DC power source and a DC ammeter are connected to each electrode of the jig.

<Jig for Measurement of Volume Resistivity>
Main electrode (50 mm in diameter)
Counter electrode (85 mm in diameter)
Ring-like guard electrode surrounding main electrode (80 mm in outer diameter, 70 mm in inner diameter).

Each electrode is made of gold-plated copper, and conductive rubber is pasted on the surface that is to be in contact with a sample. The conductive rubber used herein is EC-60BL (W300) that is available from Shin-Etsu Chemical Co., Ltd., and pasted so that the glossy surface of the conductive rubber is in contact with the gold-plated copper.

Next, a biaxially-oriented polypropylene film (hereinafter, also referred to as sample) of Examples and Comparative Examples was placed in an environment of 23° C., 50% RH for 24 hours. Thereafter, the sample was set in the jig in the thermostatic bath. Specifically, the main electrode and the guard electrode were brought into close contact with one surface of the biaxially-oriented polypropylene film, and the counter electrode was brought into close contact with the other surface, and the biaxially-oriented polypropylene film and the electrodes were brought into close contact with each other with a load of 5 kgf. Then the sample was left to stand for 30 minutes.

Next, a voltage was applied on the sample so that the potential gradient was 200 V/μm.

A current value was read 1 minute after application of voltage, and volume resistivity was calculated according to the following formula. For application of voltage, 2290-10 (DC power source) available from Keithley was used, and for measurement of a current value, 2635B (DC Picoammeter) available from Keithley was used.

Volume resistivity=[(effective electrode area)×(applied voltage)]/[(thickness of biaxially-oriented polypropylene film)×(current value)]

Here, the effective electrode area was determined according to the following formula.

(Effective electrode area)=π×[[[(inner diameter of main electrode)+(inner diameter of guard electrode)]/2]/2]$^2$ <Tensile Strength>
The tensile strength of the polypropylene film was measured in accordance with JIS-C2151. The measuring direction was MD direction (machine direction) and the TD direction (width direction). The measuring temperature was 23° C.

<Elongation at Break, Tensile Modulus>
Elongation at break was measured in accordance with JIS K-7127(1999). Specifically, a tensile test was performed in the test conditions (measurement temperature 23° C., length of test piece 140 mm, test length 100 mm, width of test piece 15 mm, tensile speed 100 mm/minute) using a tensile compression tester (available from Minebea). Next, by the automatic analysis by data processing software incorporated in the test, an elongation at break (%) and tensile modulus (GPa) were determined.

Example 1

Example 1-1

Preparation of Cast Sheet

An extruder was supplied with PP resin A1 [Mw=320,000, Mw/Mn=9.3, Difference ($D_M$)=11.2 ("Difference ($D_M$)" is a difference obtained by subtracting a differential distribution value at a logarithmic molecular weight Log (M)−6.0 from a differential distribution value at Log(M)=4.5 in the differential distribution curve of molecular weight), mesopentad fraction [mmmm]=95%, MFR=4.9 g/10 min, available from Prime Polymer Co., Ltd.], and PP resin B1 [Mw=350,000, Mw/Mn=7.7, Difference ($D_M$)=7.2, mesopentad fraction [mmmm]=96.5%, MFR=3.8 g/10 min, available from KOREA PETRO CHEMICAL IND CO., LTD.] in a mass ratio of A1:B1=65:35, and the resins were melted at a resin temperature of 250° C., and then extruded with a T-die, and wound around a metal drum having a surface temperature retained at 95° C. to be solidified, and thus a cast sheet was prepared.

Example 1-2

Preparation of Biaxially-Oriented Polypropylene Film

The obtained unstretched cast sheet was kept at a temperature of 130° C., and caused to pass between rolls running at different speeds to be stretched to 4 times in the machine direction, and then immediately cooled to room temperature. Subsequently, the stretched sheet was guided to the tenter, and stretched to 10 times in the width direction at a temperature of 158° C. with a stretching angle of 9°, and then the sheet was subjected to relaxation and thermosetting, and wound, and subjected to an aging treatment in an atmosphere at about 30° C., to obtain a biaxially-oriented polypropylene film having a thickness of 2.5 μm.

Example 1-3

Preparation of Capacitor, Decreasing Rate of Insulation Resistance, and Rate of Change in Capacitance ΔC Then, using the obtained biaxially-oriented polypropylene film, a capacitor was prepared in the following manner. By performing aluminum vapor deposition on the biaxially-oriented polypropylene film with a T margin vapor deposition pattern at a vapor deposition resistance of 15Ω/□, a metallized film containing a metal film on either face of the biaxially-oriented polypropylene film was obtained. After slitting into a width of 60 mm, two metallized films were together wound 1076 turns at a winding tension of 250 g using an automated winder 3KAW-N2 available from KAIDO MFG. CO., LTD. The wound element was subjected to a heat treatment at 120° C. for 15 hours under pressing, and then zinc metal is thermally sprayed on the end surface to obtain a flat-shaped capacitor. A lead was soldered to the end surface of the flat-shaped capacitor, and then sealed with epoxy resin. The capacitance of the finished capacitor was 75 μF (±5 μF).

For the obtained capacitor, a DC current was applied at a test environment temperature of 105° C., at a voltage of 700 V for 1000 hours, and then the insulation resistance and the capacitance were measured, and the decreasing rate of the insulation resistance and the rate of change in capacitance ΔC were determined.

Example 2

A biaxially-oriented polypropylene film (2.5 μm thick) and a capacitor were prepared and evaluated in the same manner as in Example 1 except that the film was guided to the tenter and stretched in the width direction at a temperature of 159° C. in the preparation of the biaxially-oriented polypropylene film.

Example 3

A biaxially-oriented polypropylene film (2.5 μm thick) and a capacitor were prepared and evaluated in the same manner as in Example 1 except that the film was guided to the tenter and stretched in the width direction with a stretching angle of 11° at a temperature of 159° C. in the preparation of the biaxially-oriented polypropylene film.

Example 4

A biaxially-oriented polypropylene film (2.5 μm thick) and a capacitor were prepared and evaluated in the same manner as in Example 1 except that the film was guided to the tenter and stretched in the width direction with a stretching angle of 12° at a temperature of 159° C. in the preparation of the biaxially-oriented polypropylene film.

Example 5

A biaxially-oriented polypropylene film (2.5 μm thick) and a capacitor were prepared and evaluated in the same manner as in Example 1 except that PP resin B2 [Mw=380,000, Mw/Mn=8.3, Difference ($D_M$)=0.6 (difference obtained by subtracting a differential distribution value at a logarithmic molecular weight of 6 from a differential distribution value at a logarithmic molecular weight of 4.5 in the molecular weight distribution curve), mesopentad fraction [mmmm]=96.5%, MFR=2.3 g/10 min, available from Prime Polymer Co., Ltd.] was used in place of PP resin B1 in the preparation of the cast sheet.

Example 6

A biaxially-oriented polypropylene film (2.5 μm thick) and a capacitor were prepared and evaluated in the same manner as in Example 3 except that PP resin A2 [Mw=270,000, Mw/Mn=5.7, Difference ($D_M$)=8.8, mesopentad fraction [mmmm]=95%, MFR=5.6 g/10 min, available from Prime Polymer Co., Ltd.] was used in place of PP resin A1, and PP resin B2 was used in place of PP resin B1 in a mass ratio of A2:B2=75:25 in the preparation of the cast sheet.

Example 7

A biaxially-oriented polypropylene film (2.5 μm thick) and a capacitor were prepared and evaluated in the same manner as in Example 3 except that the cast sheet was obtained by using only PP resin B1 as a resin component in the preparation of the cast sheet.

Example 8

A biaxially-oriented polypropylene film (2.5 μm thick) and a capacitor were prepared and evaluated in the same manner as in Example 3 except that the cast sheet was obtained by using only PP resin A3 [Mw=340,000, Mw/Mn=8.1, Difference ($D_M$)=4.8, mesopentad fraction [mmmm]=97%, MFR=4.0 g/10 min, available from Borealis] as a resin component in the preparation of the cast sheet.

Comparative Example 1

A biaxially-oriented polypropylene film (2.5 μm thick) and a capacitor were prepared and evaluated in the same manner as in Example 1 except that the film was guided to the tenter and stretched in the width direction with a stretching angle of 15° at a temperature of 160° C. in the preparation of the biaxially-oriented polypropylene film.

Comparative Example 2

A biaxially-oriented polypropylene film (2.5 μm thick) and a capacitor were prepared and evaluated in the same manner as in Example 1 except that the film was guided to the tenter and stretched in the width direction with a stretching angle of 9° at a temperature of 160° C. in the preparation of the biaxially-oriented polypropylene film.

Comparative Example 3

A biaxially-oriented polypropylene film (2.5 μm thick) and a capacitor were prepared and evaluated in the same manner as in Example 1 except that the film was guided to the tenter and stretched in the width direction with a stretching angle of 5° in the preparation of the biaxially-oriented polypropylene film.

Comparative Example 4

A biaxially-oriented polypropylene film (2.5 μm thick) and a capacitor were prepared and evaluated in the same manner as in Example 1 except that the film was guided to the tenter and stretched in the width direction with a stretching angle of 8° at a temperature of 160° C. in the preparation of the biaxially-oriented polypropylene film.

Resins used in Examples 1 to 8 and Comparative Example 4

Any polypropylene resin used in Examples 1 to 8 and Comparative Example 4 was a homopolypropylene resin.

TABLE 1

| | Tenter stretching angle (°) | Tenter stretching temperature (° C.) | Crystallite size (nm) | Volume resistivity (Ω cm) | IR decreasing rate (%) | ΔC (%) | Tensile strength (MPa) | | | |
|---|---|---|---|---|---|---|---|---|---|---|
| | | | | | | | MD direction $T_{MD}$ | TD direction $T_{TD}$ | $T_{MD} + T_{TD}$ | $T_{TD}/T_{MD}$ |
| Example 1 | 9 | 158 | 11.6 | $1.2 \times 10^{15}$ | 22 | −2.2 | 206 | 317 | 523 | 1.54 |
| Example 2 | 9 | 159 | 11.8 | $1.1 \times 10^{15}$ | 30 | −2.0 | 201 | 322 | 523 | 1.60 |
| Example 3 | 11 | 159 | 11.9 | $1.2 \times 10^{15}$ | 25 | −3.7 | 199 | 322 | 521 | 1.62 |
| Example 4 | 12 | 159 | 12.2 | $1.3 \times 10^{15}$ | 47 | −3.9 | 197 | 275 | 472 | 1.40 |
| Example 5 | 9 | 158 | 11.8 | $1.4 \times 10^{15}$ | 44 | −0.9 | 220 | 330 | 550 | 1.50 |
| Example 6 | 11 | 159 | 11.8 | $1.3 \times 10^{15}$ | 40 | −3.3 | 200 | 320 | 520 | 1.60 |
| Example 7 | 11 | 159 | 12.1 | $1.9 \times 10^{15}$ | 30 | −3.1 | 204 | 320 | 524 | 1.57 |

TABLE 1-continued

| | | | | | | | | | | |
|---|---|---|---|---|---|---|---|---|---|---|
| Example 8 | 11 | 159 | 11.9 | $2.0 \times 10^{15}$ | 20 | −2.0 | 205 | 318 | 523 | 1.55 |
| Comparative Example 1 | 15 | 160 | 12.7 | $1.1 \times 10^{15}$ | 90 | −5.1 | 190 | 272 | 462 | 1.43 |
| Comparative Example 2 | 9 | 160 | 11.6 | $2.5 \times 10^{14}$ | 90 | −0.2 | 189 | 317 | 506 | 1.68 |
| Comparative Example 3 | 5 | 158 | 12.5 | $3.0 \times 10^{14}$ | 90 | −8.8 | 210 | 333 | 543 | 1.59 |
| Comparative Example 4 | 8 | 160 | 11.5 | $2.1 \times 10^{14}$ | 90 | −0.1 | 200 | 330 | 530 | 1.65 |

| | Elongation at break (%) | | | | Tensile modulus (GPa) | | | |
|---|---|---|---|---|---|---|---|---|
| | MD direction $E_{MD}$ | TD direction $E_{TD}$ | $E_{MD} + E_{TD}$ | $E_{TD}/E_{MD}$ | MD direction $M_{MD}$ | TD direction $M_{TD}$ | $M_{MD} + M_{TD}$ | $M_{TD}/M_{MD}$ |
| Example 1 | 132 | 51 | 183 | 0.39 | 2.5 | 2.8 | 5.3 | 1.12 |
| Example 2 | 130 | 58 | 188 | 0.45 | 2.3 | 3.5 | 5.8 | 1.52 |
| Example 3 | 138 | 66 | 204 | 0.48 | 2.7 | 4.1 | 6.8 | 1.52 |
| Example 4 | 129 | 39 | 168 | 0.30 | 1.8 | 3.4 | 5.2 | 1.89 |
| Example 5 | 127 | 44 | 171 | 0.35 | 2.8 | 4.5 | 7.3 | 1.61 |
| Example 6 | 128 | 55 | 183 | 0.43 | 2.5 | 4.0 | 6.5 | 1.60 |
| Example 7 | 125 | 53 | 178 | 0.42 | 2.8 | 4.4 | 7.2 | 1.57 |
| Example 8 | 126 | 45 | 171 | 0.36 | 2.5 | 4.6 | 7.1 | 1.84 |
| Comparative Example 1 | 125 | 40 | 165 | 0.32 | 1.6 | 3.3 | 4.9 | 2.06 |
| Comparative Example 2 | 142 | 60 | 202 | 0.42 | 2.9 | 4.5 | 7.4 | 1.55 |
| Comparative Example 3 | 135 | 59 | 194 | 0.44 | 2.5 | 3.8 | 6.3 | 1.52 |
| Comparative Example 4 | 130 | 59 | 189 | 0.45 | 2.4 | 3.6 | 6 | 1.50 |

As shown in Table 1, the decreasing rate of the insulation resistance in the capacitor prepared with a biaxially-oriented polypropylene film having a crystallite size of 12.2 nm or less, and a volume resistivity of $6 \times 10^{14}$ Ω cm or more was small. In the capacitor prepared with the biaxially-oriented polypropylene film having a crystallite size of 12.2 nm or less and a volume resistivity of $6 \times 10^{14}$ Ω cm or more, the rate of change in capacitance ΔC was between −5% and 0%, and the capacitance was stable even after application of a DC current at a voltage of 700 V for 1000 hours at a test environment temperature of 105° C.

<Verification of Accuracy of Measurement of Volume Resistivity>

Whether the accuracy of measurement of the method for measuring a volume resistivity in the present disclosure is higher than that of Patent Document 1 (WO 2016/182003) was verified. This will be described below.

Reference Example 1 is a test example assuming the method for measuring a volume resistivity in Patent Document 1. Reference Example 2 is a test example for confirming how the accuracy of measurement changes compared with Reference Example 1 when the potential gradient is made higher than that in Reference Example 1.

Reference Example 1

A jig, a DC power source, and a DC ammeter for measuring a volume resistivity used in the above-described Example were prepared.

Next, a biaxially-oriented polypropylene film having the same thickness of 2.3 μm as that in Example 1 of Patent Document 1 (a biaxially-oriented polypropylene film available from Oji Holdings Corporation, that is different from the biaxially-oriented polypropylene film of Example 1 described in Patent Document 1) was set in the jig, and retained at 120° C. for 30 minutes. Then, a voltage of 100 V was applied. That is, the potential gradient was 43 V/μm.

As a result, a fine current at the level of 0.1 to 0.5 nA was measured 1 minute after application of the voltage.

Using the result of the voltage and the current, a volume resistivity was determined while the diameter of the electrode area was assumed to be 10 mm. The volume resistivity was $6.8 \times 10^{14}$ Ω cm. This value is a mean value of reproducing tests (n=4). The volume resistivity was determined on the assumption that the diameter of the electrode area was 10 mm for coincidence with Patent Document 1 because the diameter of the electrode area is 10 mm in the method for measuring a volume resistivity in Patent Document 1.

The volume resistivity ($6.8 \times 10^{14}$ Ω cm) was approximate to $6.5 \times 10^{14}$ Ω cm which is a value in Example 1 of Patent Document 1. Therefore, it is recognized that the measuring method of Reference Example 1 is appropriate as a test that assumes the measuring method in Patent Document 1.

Next, a standard deviation was determined from the variation in measured current values in reproducing tests (n=4). As a result, the standard deviation was $1.2 \times 10^{14}$ Ω cm. Also a coefficient of variation was calculated, and the result was about 18%.

The coefficient of variation is a value determined in the following manner.

(Coefficient of variation)=(standard deviation)/(mean value)

While the measurement is performed at 110° C. in Patent Document 1, the measurement is performed at 120° C. in Reference Example 1. This attributes to the following reason.

When measurement was performed at 110° C. in the test method of Reference Example 1, the measured current value was smaller than that in Patent Document 1. In order to reproduce the measuring method of Patent Document 1 more correctly, the present inventor decided to measure at 120° C. in Reference Example 1. When the measurement was performed at 110° C. in the test method of Reference Example 1, the measured current value was not equivalent to the current value in Patent Document 1. This is attributable to that the biaxially-oriented polypropylene film used in measurement was not the same with that in Patent Document 1.

Reference Example 2

Likewise Reference example 1, a jig, a DC power source, and a DC ammeter for measuring a volume resistivity used in the above-described Example were prepared.

Next, the biaxially-oriented polypropylene film that is the same with that used in Reference Example 1 was set in the jig, and retained at 120° C. for 30 minutes. Then, a voltage of 200 V was applied in Reference Example 2. That is, in Reference Example 2, the potential gradient was 87 V/μm. The current value was measured in the same manner as in Reference Example 1 except for the potential gradient. As a result, a current of 11 to 12 nA was measured.

Using the result of the voltage and the current, a volume resistivity was determined while the diameter of the electrode area was assumed to be 10 mm. The volume resistivity was $5.9 \times 10^{13}$ Ω cm. This value is a mean value of reproducing tests (n=4).

Next, a standard deviation was determined from the variation in measured current values in reproducing tests (n=4). As a result, the standard deviation was $3.3 \times 10^{12}$ Ω cm. Also a coefficient of variation was calculated, and the result was about 6%.

(Discussion)

As shown in Reference Example 1, it can be found that the obtained current is at the level of pA (picoampere) and the value is not stabilized in the method for measuring a volume resistivity in Patent Document 1, but the value is stabilized when the measurement is performed at a current at the level of nA (nanoampere) as in Reference example 2.

In Reference Example 2, it is demonstrated that the value is stabilized when the potential gradient is 87 V/μm in comparison with Reference Example 1 in which the potential gradient is 43 V/μm. Therefore, it can be found that the value is further stabilized when the potential gradient is 200 V/μm (when compared with the present method for measuring a volume resistivity) in comparison with the method for measuring a volume resistivity of Patent Document 1.

These reveal that the accuracy of the present method for measuring a volume resistivity in the present disclosure is high.

The invention claimed is:

1. A polypropylene film comprising:
    a crystallite size determined using Scherrer's equation from a full width at half maximum of the reflection peak from (040) plane of a crystal measured by a wide-angle X-ray diffraction method of 12.2 nm or less, and
    a volume resistivity calculated in accordance with Equation I from a current value 1 minute after applying a voltage at a potential gradient 200 V/μm in an environment of 100° C. of $6 \times 10^{14}$ Ω cm or more, the Equation I being Volume resistivity=[(effective electrode area)×(applied voltage)]/[(thickness of polypropylene film)×(current value)].

2. The polypropylene film according to claim 1, wherein a melting point of first heating in a differential scanning calorimetry is 165° C. or more.

3. The polypropylene film according to claim 1, for use in a capacitor.

4. The polypropylene film according to claim 1, wherein the polypropylene film is a biaxially-oriented film.

5. The polypropylene film according to claim 1, wherein
    a total of a tensile strength in a first direction and a tensile strength in a direction perpendicular to the first direction is 450 to 600 MPa,
    a total of an elongation at break in the first direction and an elongation at break in the direction perpendicular to the first direction is 150 to 220%, and
    a total of a tensile modulus in the first direction and a tensile modulus in the direction perpendicular to the first direction is 5 to 10 GPa.

6. A metal layer-integrated polypropylene film comprising:
    the polypropylene film according to claim 1; and
    a metal layer stacked on either face or both faces of the polypropylene film.

7. A film capacitor having the metal layer-integrated polypropylene film according to claim 6 that is wound.

* * * * *

UNITED STATES PATENT AND TRADEMARK OFFICE
CERTIFICATE OF CORRECTION

| | |
|---|---|
| PATENT NO. | : 11,342,116 B2 |
| APPLICATION NO. | : 16/633062 |
| DATED | : May 24, 2022 |
| INVENTOR(S) | : Michiko Sueyoshi et al. |

It is certified that error appears in the above-identified patent and that said Letters Patent is hereby corrected as shown below:

In the Specification

Column 1, Line 55, delete "DOCUMENTPATENT" and insert -- DOCUMENT PATENT --.
Column 2, Line 52, delete "of a" and insert -- of $\alpha$ --.
Column 5, Line 7, delete "of a" and insert -- of $\alpha$ --.
Column 5, Line 44, delete "of a" and insert -- of $\alpha$ --.
Column 5, Line 59, delete "$R_V=(A_E \times V_A)+(T_F \times C_E)$" and insert -- $R_V=(A_E \times V_A) \div (T_F \times C_E)$ --.
Column 6, Line 44, delete "$A_E-\pi \times (D_M+D_G)^2/16$" and insert -- $A_E=\pi \times (D_M+D_G)^2/16$ --.
Column 7, Line 17, delete "of a" and insert -- of $\alpha$ --.
Column 11, Line 32, delete "Log(M)–6.0" and insert -- Log(M)=6.0 --.
Column 17, Line 1, delete "$M_{MD}+M_{TD}$)" and insert -- ($M_{MD}+M_{TD}$) --.
Column 18, Line 44 (approx.), delete "((" and insert -- ( --.
Column 20, Line 49, delete "the a" and insert -- the $\alpha$ --.
Column 20, Line 53, delete "the a" and insert -- the $\alpha$ --.
Column 22, Line 2-3, delete "Log(M)–6.0" and insert -- Log(M)=6.0 --.

In the Claims

Column 28, Line 9 (approx.), in Claim 1, delete "of a" and insert -- of $\alpha$ --.

Signed and Sealed this
Third Day of October, 2023

Katherine Kelly Vidal
*Director of the United States Patent and Trademark Office*